United States Patent [19]

Miller et al.

[11] Patent Number: 4,511,038
[45] Date of Patent: Apr. 16, 1985

[54] CONTAINER FOR MASKS AND PELLICLES

[75] Inventors: Anne K. M. Miller, Redwood City; Richard Mason, Campbell, both of Calif.

[73] Assignee: EKC Technology, Inc., Hayward, Calif.

[21] Appl. No.: 574,743

[22] Filed: Jan. 30, 1984

[51] Int. Cl.³ .................. B65D 85/48; B65D 81/16
[52] U.S. Cl. ..................................... 206/454; 206/332
[58] Field of Search .................. 206/332, 316, 454

[56] References Cited
U.S. PATENT DOCUMENTS

| | | | |
|---|---|---|---|
| 3,482,682 | 12/1969 | Cronkhite | 206/332 |
| 3,489,265 | 1/1970 | Puente | 206/316 |
| 3,615,006 | 10/1971 | Freed | 206/454 |

Primary Examiner—William T. Dixson, Jr.
Attorney, Agent, or Firm—Julian Caplan

[57] ABSTRACT

Pellicles such as those shown in U.S. Pat. No. 4,131,363 are attached to photographic masks used in suitable exposure equipment to transfer a desired pattern on the mask to a photosensitive surface, such as an integrated circuit wafer coated with a photoresist. The pellicle removes impurities such as dust from the plane of the mask a sufficient distance so that the impurity is not focused on the photosensitive surface. The present invention provides a container in which a mask with a pellicle attached may be stored between uses in a dust-free atmosphere, with the fragile surface of the pellicle protected. Initially, the pellicle, before being attached to the mask, may be supported on a detachable tray positioned in the same container during transportation from its place of manufacture and storage to the place where it is applied to the mask.

16 Claims, 9 Drawing Figures

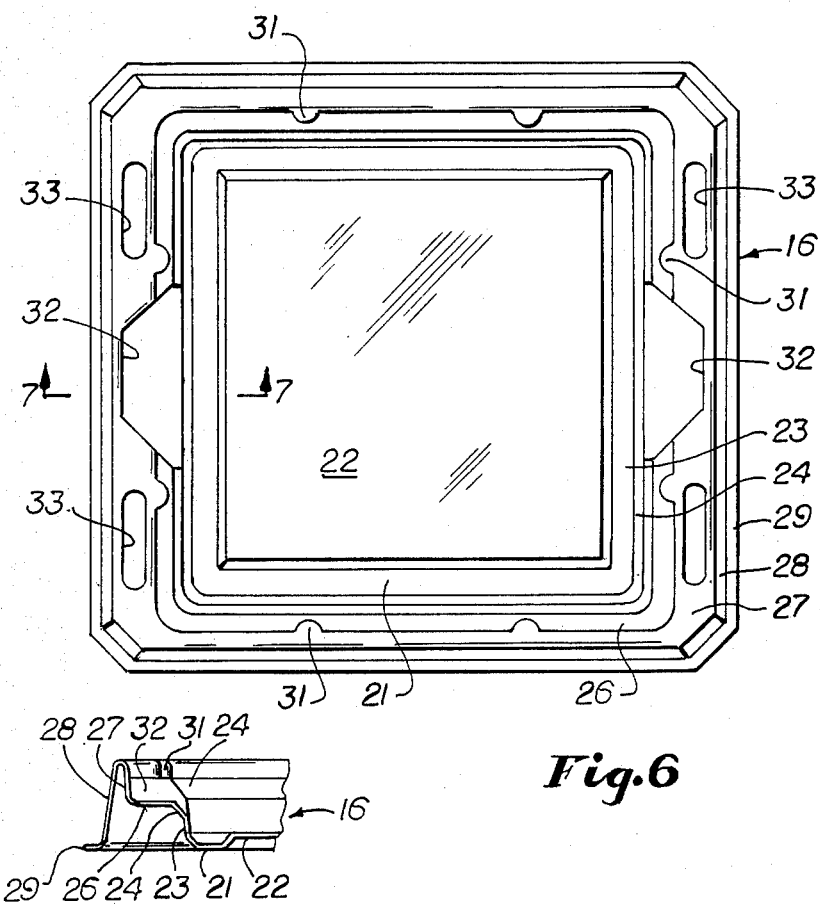
Fig.6
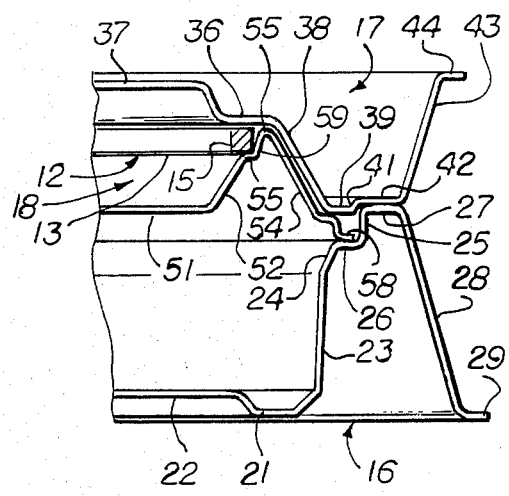
Fig.7
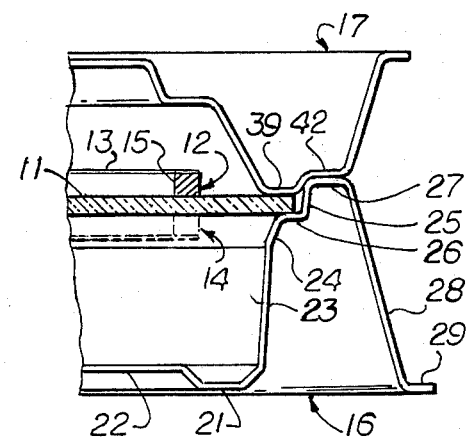
Fig.8
Fig.9

CONTAINER FOR MASKS AND PELLICLES

This invention relates to a new and improved container for masks and pellicles. Masks used with photographic exposure equipment to transfer a desired pattern on the mask to a photosensitive surface are commonly used in the electronics industry for such purpose as manufacture of integrated circuit wafers. The image of any dust or other impurity on the mask may be transferred to the workpiece. Accordingly, the use of pellicles fixed to one or both surfaces of the mask has become common industry practice. Such pellicles comprise a ring carrying a thin transparent membrane on one edge. The opposite edge of the pellicle is fixed to one surface of the mask as by double-sided adhesive tape. Any dust or other impurity which lodges on the membrane is out of the focal plane of a photographic exposure machine and, hence, its image is not transferred to the workpiece. Masks with pellicles attached are sometimes used repeatedly and must be stored over a period of time.

Because of the fragile nature of the pellicle membrane, storage of masks with pellicles attached requires protection of the device from contamination, breakage and other hazards. The present invention provides a container for masks protecting against such hazards. Additionally, a tray or insert may be placed in the container to hold a pellicle from the time of its manufacture to the time it is applied to a mask.

The precent invention, therefore, provides a container for storage of masks to which single or double pellicles have been applied which is dust-tight and prevents accidental contact with the surface of the mask or the pellicles which might destroy or seriously damage the same. The container is comparatively shock resistant, so that if it is accidentally jarred or dropped the glass mask or the pellicle membrane may nevertheless be preserved.

Another feature of the invention is the fact that the container is made of a transparent, thin-walled plastic, so that the contents are visible without opening the box.

Details of construction of the container are the provision of guides for precise location of the mask, depressions providing access to lift the mask from the container and means to secure the edges of the mask tightly clamped between the top and the bottom of the container so that it cannot be dislodged from position.

A still further feature of the invention is the provision of a tray which fits between the top and bottom of the container into which a pellicle can be inserted before it is attached to the mask. The container, with tray inserted, holds the pellicle securely during transportation and storage from the pellicle manufacturer to the point where it is attached to the mask. The tray is inexpensive and may be discarded once the pellicle is positioned on the mask.

Other objects of the present invention will become apparent upon reading the following specification and referring to the accompanying drawings in which similar characters of reference represent corresponding parts in each of the several views.

In the drawings

FIG. 6 is a top plan view of a base for the container of the present invention;

FIG. 7 is a fragmentary sectional view taken substantially along the line 7—7 of FIG. 6;

FIG. 8 is an enlarged fragmentary sectional view through the container with tray and pellicle inserted therein;

FIG. 9 is a view similar to FIG. 8 with the tray removed and a mask with two pellicles attached inserted in the container.

Figure 1:
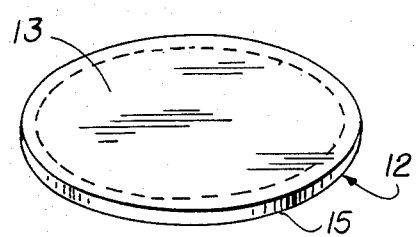
FIG. 1 is a perspective view of a typical pellicle with which the present invention is used.

The present invention is used for transportation and storage of a mask 11 which is frequently a square piece of glass five inches by five inches and, characteristically, either 90 or 120 mils in thickness. A design (not shown) to be photographically reproduced is applied to one surface of mask 11. To prevent dust or other contaminant from lodging on the surface of mask 11, a pellicle 12 such as that shown in FIG. 1 may be attached to one or both surfaces. Pellicle 12 consists of ring 15 of rectangular cross-section supporting a thin transparent, fragile membrane 13. Ring 15 spaces the membrane 13 from the surface of mask 11. Hence, dust or other impurities do not lodge on the design on mask 11, but rather lodge on the membrane 13. Membrane 13 is spaced from the surface 11 so that impurities on the membrane are out of focus when the mask is exposed in photographic equipment. The fact that the masks 11 are of glass and the membranes 13 are of extremely fragile material requires that they be protected during transportation and storage. The present invention provides a container for such purpose.

As shown in FIG. 9, a second pellicle 14 may be applied to a second surface of mask 11. Pellicles 12, 14 are usually circular, but may be square or other shape.

The container of the present invention comprises a base 16, a cover 17 and a tray 18 for transportation and storage of a pellicle before it is applied to the mask. The members are preferably square in plan with truncated corners formed with thin, transparent walls of uniform thickness of a lightweight material such as polyvinylchloride.

Directing attention to FIG. 6, base 16 has a narrow annular bottom 21 here shown with a square depression 22 formed in the center. Inner sides 23 extend upward and slightly outwardly and terminate in a slanted ledge 24 which extends outwardly-upwardly. Above ledge 24 is a horizontal ledge 26 which is narrow and extends outwardly. Intermediate sides 24 extend upwardly and merge with top horizontal surface 27. Outer sides 28 slant downwardly-outwardly from surface 27 and terminate in a peripheral rim 29 which is preferably at the same elevation as bottom 21. It will be seen that the cross-section construction of the base 16 as best shown in FIG. 7 provides a resilient, shock resistant support for the mask 11 which rests on the slanted edge 24 (see FIG. 9).

Formed extending inwardly of intermediate sides 25 and merging with horizontal ledge 26 are semi-cylindrical guides 31. There are preferably two guides 31 on each of the four sides of base 16. These guides assist in locating the mask 21 supported by the slanted edge 24. On at least one side of base 16 extending downward from top edge 27 to a location below the bottom of slanted edge 24 is a removal depression 32 which provides access for the fingers or an implement to be inserted under the mask 11 to facilitate placement or removal thereof. Further, there is at least one elongated locking depression 33 in at least two sides of base 16 to receive mating protuberances of the cover 17 to secure the cover and base in assembled condition.

Figure 3:
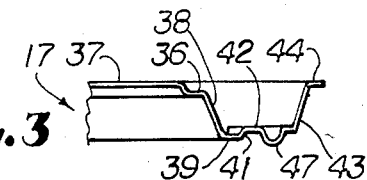
FIG. 3 is a fragmentary sectional view taken substantially along the line 3—3 of FIG. 2.
Figure 2:
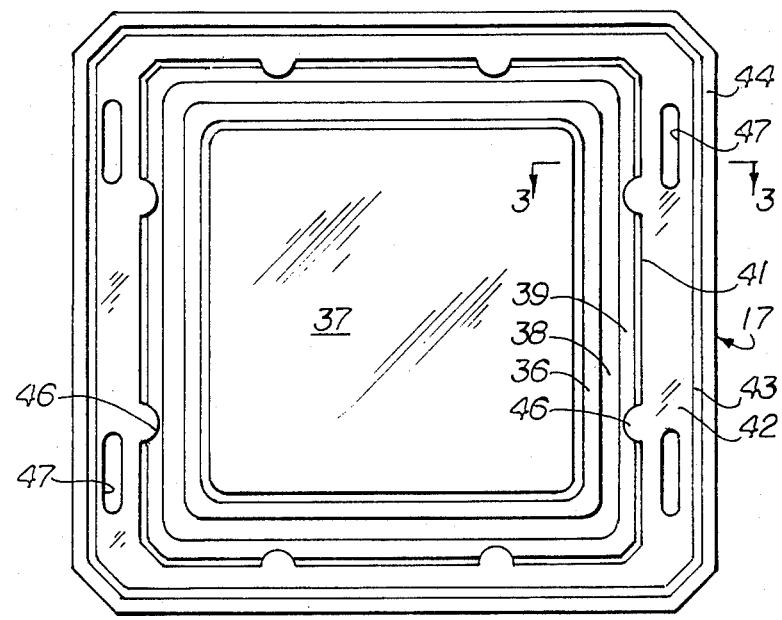
FIG. 2 is a top plan view of the cover of the container of the present invention.

Directing attention now to FIGS. 2 and 3, cover 17 has a narrow annular top edge 36 above which is a central square nesting protrusion 37 which may mate with the nesting depression 33 of base 16 so that several containers may be stacked. Slanting downwardly-outwardly from top 36 are inner sides 38 which terminate in bottom ledge 39. Extending upwardly from the outer edge of ledge 39 is an intermediate side 41 which extends upwardly and outwardly a short distance and merges with an annular horizontal ledge 42 which, in the assembled condition of the container, rests upon top edge 27 of base 16. Outer sides 43 extend upwardly-outwardly from the outer edge of ledge 42 and terminate in an outward directed rim 44 of the same elevation as protuberance 37.

Extending inward in surfaces 41 and 39 are notches 46 which mate with the guides 31 of base 16. Locking protuberances 47 extend from horizontal ledge 42 and mate with the depressions 33 of base 47. In the assembled condition of the container shown in FIG. 8, the protuberances 47 lock within the depressions 33 and hold the container assembled with a mask 11 secured therebetween.

Figure 4:
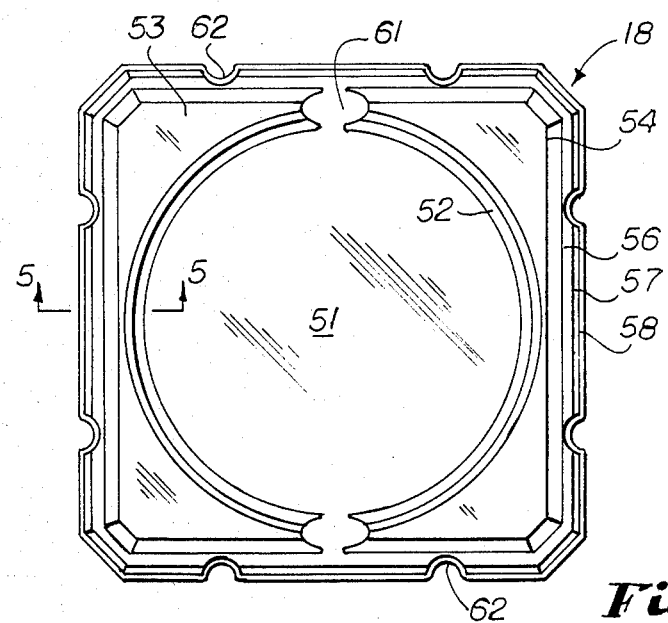
FIG. 4 is top plan view of a tray for a pellicle in accordance with the present invention.
Figure 5:
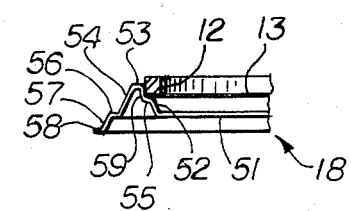
FIG. 5 is a fragmentary sectional view taken substantially along the line 5—5 of FIG. 4.

Directing attention now to the tray 18 shown in FIGS. 4 and 5, bottom 51 is round and has a diameter approximately equal to the outside diameter of ring 15. If pellicle 12 is other than round, the shape of bottom 51 is complementary. From the bottom 51 there are conical upwardly-outwardly slanted sides 52 which merge into a narrow annular shelf 55 which has an outer diameter equal to the outer diameter of the ring 15 of the pellicle 12 and supports the same. Above shelf 55 is an outwardly-upwardly slanted wall 59 which merges with the square outline top 53.

Intermediate sides 54 slant downwardly-outwardly from top ledge 53 merging into horizontal ledge 56. Below ledge 56 are outer sides 57 which terminate in a peripheral rim 58.

At least one removal depression 61 extends down from the top ledge 53 to the level of bottom 51. This permits the finger or an implement to be inserted beneath the pellicle rim 15. Notches 62 formed extending inward from rim 58, outer sides 57 and ledge 56 match with the guides 31 of base 16.

When a pellicle is being shipped or stored unattached to a mask 11, the tray 18 is employed. The ring 15 rests on shelf 55. The tray 18 is inserted in the base 16 with the rim 58 resting on horizontal ledge 26 and the guides 31 fitting into the notches 62. Cover 17 is then applied, the top 56 resting on the top edge of the ring 15 and holding the same so that the pellicle 12 is not loose in the container. Locking depressions 33 of base 16, receive the protuberances 47 of cover 17 and the parts are secured together by friction.

When the pellicle 12 is received at the point where it is to be attached to the mask 11, the cover 17 is removed. Fingers or an implement, are inserted through the removal depression 61 to lift the pellicle 12 from the tray 18. Thereupon, the tray 18 may be discarded. By means forming no part of the present invention, the pellicle 12 is attached to the mask 11. As shown in FIG. 9, two pellicles may be attached on opposite surfaces of the mask 11.

To store the mask 11, it is first inserted in the base 16, using the fingers or an implement, the removal depressions 32 facilitating the placement. In such position, the outer edge of the mask 11 rests on slanted ledge 24. Guides 31 facilitate proper positioning and also preventing the mask from rattling around in the container. The locking depressions 33 and locking protuberances 47 secure the parts together as has previously been explained. Thus, the mask 11 is secured within the container so that it does not move. At the same time, there is adequate space above and below the mask 11 for the top pellicle 12 and bottom pellicle 14 and the membranes 13 thereof are not damaged. The mask may be removed from the box after the cover 17 has been removed using the fingers or an implement to provide access through the depression 32 under the mask 11.

What is claimed is:

1. A container for a mask of the type having a thin, fragile body having a regular peripheral first shape comprising a first part and a second part, one of said parts being a base and the other said part being a cover, said first part comprising a first surface, first inner sides extending from said first surface, a first ledge beyond said first inner sides having a second shape complementary to said first shape, a peripheral first edge, first means spacing said first edge spaced from said first ledge farther from said first surface than the thickness of a conventional mask and also outwardly, said first inner sides being higher than the thickness of a conventional pellicle used with a conventional mask, said second part comprising a second surface, second inner sides extending from said second surface, a second ledge generally complementary to said first shape said second ledge being spaced from said first ledge a distance equal to the thickness of said mask, whereby said body when positioned on said first ledge is clamped only at its outer edges between said first and second ledges, a second ledge dimensioned to abut said first edge in the assembled condition of said container, and second means spacing said second edge spaced from said second ledge closer to said second surface than said second ledge and also outwardly, said second inner sides being higher than the thickness of a conventional pellicle.

2. A container according to claim 1 in which said mask is rectangular and said first and second parts are generally rectangular in plan.

3. A container according to claim 2 which further comprises cooperating latching means on said first and second edges.

4. A container according to claim 2 in which said first ledge is spaced from said first surface a distance greater than the thickness of a conventional pellicle.

5. A container according to claim 2 in which said first ledge is slanted outwardly toward said first ledge.

6. A container according to claim 2 in which said first means comprises a third ledge generally horizontal at the edge of said first ledge remote from said first surface and spacing means spacing said first edge from said third ledge.

7. A container according to claim 6 which further comprises on each side of said first part a plurality of guide means extending inward from said spacing means to about the outermost edge of said first ledge.

8. A container according to claim 7 in which said guide means comprise spaced, substantially semi-cylindrical protrusions from said spacing means.

9. A container according to claim 6 which further comprises at least one depression in said third ledge and said first ledge to provide access below a portion of a mask resting on said first ledge for placement or removal of said mask relative to said first part.

10. A container according to claim 1 which further comprises first outer sides on said first part extending from said first edge outwardly to the elevation of said first surface.

11. A container according to claim 1 which further comprises second outer sides on said second part extending from said second edge outwardly to the elevation of said second surface.

12. A container for a mask of the type having a thin fragile body having a regular peripheral first shape comprising a first part and a second part, one of said parts being a base and the other part being a cover,
said first part comprising a first surface, first inner sides extending from said first surface, a first ledge beyond said first inner sides having a second shape complementary to said first shape, a peripheral first edge, first means spacing said first edge spaced from said first ledge farther from said first surface than said first ledge and also outwardly,
said second part comprising a second surface, second inner sides extending from said second surface, a second ledge generally complementary to said first shape, a second edge dimensioned to about said first edge in the assembled condition of said container, and second means spacing said second edge spaced from said second ledge closer to said second surface than said second ledge and also outwardly, and a tray removable from said container and shaped to fit within said first and second parts, said tray comprising a third surface, first tray sides extending outward and away from said third surface, a pellicle support ledge at the outer edge of said first tray sides shaped complementary to a conventional pellicle to support a first edge of said pellicle, a rim shaped to fit on said first means of said first part, and third means spacing said rim from said pellicle support ledge on the side of said third surface opposite said third surface and also outwardly of said pellicle support ledge,
said second surface being positioned to engage a second edge of said pellicle to retain said pellicle in said tray between said first and second parts.

13. A container according to claim 12 in which said third means fits immediately inside said second means.

14. A container according to claim 12 which further comprises on each side of said first part a plurality of guide means to about the outermost edge of said first ledge, said rim being shaped to receive said guide means.

15. A container according to claim 14 in which said guide means comprises spaced substantially semi-cylindrical protrusions from said spacing means and said rim is formed with semi-circular notches into which said guide means extend.

16. A container according to claim 12 which further comprises at least one first depression in said third ledge and said first ledge to provide access below a portion of a mask resting on said first ledge for removal of said mask from said first part, said tray sides being formed with at least one second depression communicating with said first depression to provide access below a portion of a pellicle resting on said pellicle support ledge for removal of said pellicle from said tray.

* * * * *